(12) United States Patent
Venkatraman et al.

(10) Patent No.: US 6,700,445 B2
(45) Date of Patent: Mar. 2, 2004

(54) FILTER CIRCUITS BASED ON TRANS-CONDUCTOR CIRCUITS

(75) Inventors: Srinivasan Venkatraman, Bangalore (IN); Abhijit Kumar Das, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/126,509

(22) Filed: Apr. 22, 2002

(65) Prior Publication Data

US 2003/0197562 A1 Oct. 23, 2003

(51) Int. Cl.[7] .............................. H03F 3/191; H03F 3/45
(52) U.S. Cl. ........................................ 330/303; 330/258
(58) Field of Search ........................... 330/85, 258, 260, 330/259, 303

(56) References Cited

U.S. PATENT DOCUMENTS

| | | | | |
|---|---|---|---|---|
| 5,844,442 A | * | 12/1998 | Brehmer | 330/258 |
| 5,854,574 A | * | 12/1998 | Singer et al. | 330/260 |
| 5,955,922 A | * | 9/1999 | Nicollini et al. | 330/258 |
| 6,359,510 B1 | * | 3/2002 | Ishii et al. | 330/260 |

OTHER PUBLICATIONS

Francesco Rezzi, Andrea Baschirotto and Rinaldo Castello; Entitled;"A 3 V 12–55 MHz BiCMOS Pseudo–Differential Continuous–Time Filter"; IEEE Transactions on Circuits and Systems–I:Fundamental Theory and Applications, vol. 42, No. 11, Nov. 1995 ; (8 Pages).

Saska Lindfors, Kari Halonen, and Mohammed Ismail; Entitled,"A 2.7–V Elliptical MOSFET–Only $g_m$C–OTA Filer"; IEEE Transactions on Circuits and Systems–II: Analog and Digital Processing, vol. 47, No. 2,Feb. 2000; (7 Pages).

Jaap Van Der Plas; Entitled:"MOSFET–C Filter with Low Excess Noise and Accurate Automatic Tuning";Integrated Continuous–Time Filters –Principles, Design, and Applications: IEEE Journal of Solid–State Circuits, vol. 26,No. 7, Jul. 1991; (10 Pages).

Bram Nauta; Entitled:"A CMOS Transconductance–C Filter Technique for Very High Frequencies";Integrated Continuous–Time Filters –Principles, Design, and Applications: IEEE Journal of Solid–State Circuits, vol. 27,No. 2, Feb. 1992; (12 Pages).

Scott T. Dupuie and Mohammed Ismail; Entitled:"High Frequency CMOS Transconductors"; IEEE Circuits and Systems Series 2: Analogue IC design: the current–mode approach;(10 Pages).

Johns, David, et al., *Analog Integrated Circuit Design*, John Wiley & Sons, Inc., Nov. 15, 1996, pp. 609–611.

Szczepanski, Stanislaw, et al., "Highly Linear Voltage–Controlled CMOS Transconductors," IEEE Transactions on Circuits and Systems—I: Fundamental Theory and Applications, vol. 40, No. 4, Apr. 1993, pp. 258–262.

* cited by examiner

*Primary Examiner*—Khanh Van Nguyen
(74) *Attorney, Agent, or Firm*—J. Dennis Moore; W. James Brady, III; Frederick J. Telecky, Jr.

(57) ABSTRACT

A filter circuit uses a trans-conductor circuit coupled to a control circuit having similar characteristics as the trans-conductor circuit. The control circuit is used to set and/or control the quiescent voltage of the trans-conductor circuit. As a result, the trans-conductor circuit may be designed to operate across a large frequency range while consuming minimal power. The control circuit may be operated using direct current (dc) voltage and may be implemented similar to the trans-conductor circuit implemented in the filter circuit.

15 Claims, 1 Drawing Sheet

FILTER CIRCUITS BASED ON TRANS-CONDUCTOR CIRCUITS

BACKGROUND OF THE INVENTION

1. Field of the Invention

The present invention relates to filter circuits, and more specifically to a method and apparatus for implementing filter circuits based on trans-conductor circuits.

2. Related Art

Filter circuits are generally implemented to perform corresponding transfer functions as is well known in the relevant arts. By the appropriate choice of transfer functions, filter circuits may be implemented to provide corresponding utilities (e.g, low pass filter, band pass filter). Filter circuits may be used in several environments such as signal receiving systems, digital circuits, etc., as is well known in the relevant arts.

Filter circuits are often implemented using components such as trans-conductors and operational amplifiers. In some environments, it may be desirable to implement filter circuits using trans-conductors at least in that trans-conductors generally consume less electrical power than operational amplifiers. For further information on trans-conductors, the reader is referred to a book entitled, AAnalogue IC Design: The current-mode approach@, by C. Toumazou, F. J. Lidge & D. G. Haigh, ISBN No.:086341 215 7, and is incorporated in its entirety herewith.

However, one typical problem with trans-conductor circuits based filter circuits is that the noise components introduced into the output signals is generally high at least compared to operational amplifiers based circuits. One way to reduce the noise component is by operating the filter circuits at high voltage levels or high power levels. However, such operation generally consumes more electrical power, and may be undesirable at least in some environments. In addition or in the alternative, the area (on an integrated circuit) of the trans-conductor circuits may have to be increased to reduce the noise factor, which may also be undesirable in many environments.

What is therefore required is a filter circuit based on trans-conductor circuits which satisfies one or more of the above-noted requirements.

SUMMARY OF THE INVENTION

A basic block implemented according to an aspect of the present invention may be used to implement a filter circuit. In an embodiment, the basic block contains a biasing circuit providing a biasing signal to set an operating point of a trans-conductor circuit and a common-mode feedback circuit providing a feedback signal to stabilize the trans-conductor circuit, with the biasing signal and the feedback signal being combined and provided on a common path to the trans-conductor circuit.

Due to the use of the common path, the number of components (including transistors) to implement the basic block may be reduced. As a result, the noise introduced by the components of a filter circuit and the total electrical power consumed may be minimized.

An embodiment of the basic block may further include a control circuit generating a quiescent voltage of the trans-conductor circuit, with the control circuit being implemented to have a same (or similar) transfer function as the trans-conductor circuit. The biasing circuit may set the operating point of the trans-conductor circuit based on the quiescent voltage also. In one implementation, the control circuit is implemented similar (in terms of components and connectivity) to the trans-conductor circuit and operated on by using a D.C. voltage to generate the quiescent voltage of the trans-conductor circuit.

The common-mode feedback circuit may contain a common mode sense circuit generating a common mode voltage, and an error amplifier may amplify the common mode voltage and providing a resulting amplified output to the biasing circuit. In an embodiment, the trans-conductor circuit is implemented using PMOS transistors and the biasing circuit is implemented using NMOS transistors.

Further features and advantages of the invention, as well as the structure and operation of various embodiments of the invention, are described in detail below with reference to the accompanying drawings. In the drawings, like reference numbers generally indicate identical, functionally similar, and/or structurally similar elements. The drawing in which an element first appears is indicated by the leftmost digit(s) in the corresponding reference number.

BRIEF DESCRIPTION OF THE DRAWINGS

The present invention will be described with reference to the accompanying drawings, wherein.

FIG. (FIG.) 1 is a circuit diagram illustrating the details of an example device in which the present invention may be implemented.

DETAILED DESCRIPTION OF THE PREFERRED EMBODIMENTS

1. Overview and Discussion of the Invention

According to an aspect of the present invention, a biasing signal designed to set an operating point of a trans-conductor circuit and a common mode feedback signal for the trans-conductor circuit are combined and provided on a common path to the trans-conductor circuit. As a result, the number of components used to implement a filter circuit may be reduced, leading to lower noise and reduction of electrical power consumption.

Several aspects of the invention are described below with reference to example devices for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well-known structures or operations are not shown in detail to avoid obscuring the invention.

2. Example Device

Figure 1:
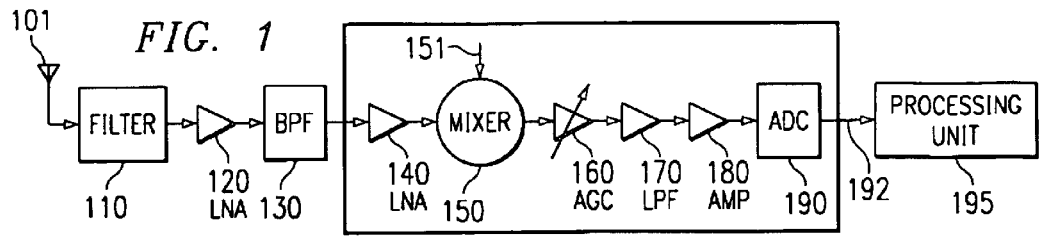

FIG. 1 is a block diagram of receiver device 100 illustrating an example device in which the present invention may be implemented. For illustration, it is assumed that receiver device 100 is implemented within a Global Positioning System Receiver. However, receiver device 170 can be implemented in other devices (e.g., mobile phone, etc., in which reduction of power consumption is of importance) as well. Receiver device 100 is shown containing antenna 101, filter 110, low noise amplifiers (LNA) 120 and 140, band pass filter 130, mixer 150, automatic gain controller 160, filter circuit 170, amplifier 180, analog to digital converter (ADC) 190, and processing unit 195. Each component is described in further detail below.

Antenna 101 may receive various signals transmitted from satellites, etc. The received signals may be provided to filter 110. Filter 110 may perform a corresponding transfer function to generate signals of the frequencies of interest. The generated signals are provided to LNA 120. Antenna 101 and filter 110 may be implemented in a known way.

LNA 120 amplifies the signals received on line 112 to generate a corresponding amplified signal on line 123. Band pass filter (BPF) 130 may filter the amplified signal to remove any unwanted noise components that may be present. The filtered signal thus generated may be provided to LNA 140. LNA 140 may again amplify the filtered signals and provide the amplified filtered signal to mixer 150. LNAs 120 and 140, and BPF 130 may also be implemented in a known way.

Mixer 150 may be used to convert a high frequency signal to a signal having any desired frequency. In an embodiment, a signal of frequency 1575 MHz is converted to a 4 MHz signal. Mixer 150 may receive filtered amplified signal and a signal of fixed frequency as inputs. The signal (on path 151) of fixed frequency may be generated by a phase locked loop (not shown) in a known way.

Automatic gain control (AGC) 160 may be used to amplify or attenuate the signal (from mixer 150) according to various requirements. For example, if a user using a mobile phone is in an area where the signals received are of low strength, and AGC 160 amplifies the signal accordingly. Similarly, if the user moves to an area where the signal strength is relatively higher, AGC 160 may attenuate the signal.

Filter circuit 170 may remove any unwanted noise components present in the signal received on line 167 to generate a filtered signal. The filtered signal may be provided to amplifier 180. Amplifier 180 may further amplify the signal received on line 178 to generate an amplified signal. The amplified signal may be provided to analog to digital converter (ADC) 190. It may be noted that all the above components of FIG. 1 operate on signals that are analog in nature.

ADC 190 converts the analog signal received on line 189 to a corresponding digital signal. The digital signal on line 192 may then be provided to processing unit 195 for further processing.

It may be desirable to minimise electrical power consumption or to reduce the degree of unwanted noise introduced in many components such as low pass filter 170 and amplifier 180. The manner in which such advantages may be obtained is described below with reference to filter circuit 170 for illustration.

3. Implementation of Filter Circuit

Figure 2:
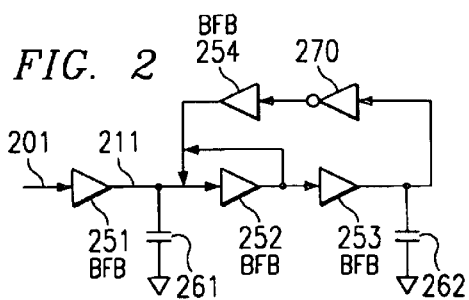
FIG. 2 is a circuit diagram illustrating the details of an embodiment of a filter circuit.

FIG. 2 is a block diagram illustrating the details of an embodiment of filter circuit 170. For illustration, filter circuit 170 is shown as a second order filter in FIG. 2. However, filter circuit 170 may also be used to implement filters corresponding to any order. Filter circuit 170 is shown containing basic filter blocks 251 through 254, capacitors 261 through 262 and inverter 270. Each component is described in further detail below.

Basic filter block (BFB) 251 receives an input signal with a voltage level of "Vin" on line 201 to generate a corresponding output signal with a current level of "Iout" on line 211. The signals on line 211 may be represented as follows:

$$Iout = Vin * Gm \quad \text{Equation (1)}$$

$$Vout = Iout * \text{Impedance of capacitor } 261 \quad \text{Equation (2)}$$

wherein 'Vin' represents the voltage of the input signal, 'Iout' represents the current of the output signal, 'Gm' represents the trans-conductance of a trans-conductor circuit contained within BFB 251, and '*' represents the multiplication operation, and Vout represents the voltage on line 211.

Basic filter blocks 252–254 also operate similar to equations (1) and (2). Basic filter blocks 251–254 may be implemented using differential trans-conductor circuits. However, as noted above in the background section, trans-conductor circuits may introduce noise into the output signals and/or operate at high voltage. The manner in which basic filter blocks 251–254 may be implemented using differential trans-conductor circuits while addressing such concerns is described below in further detail.

4. Implementation of Basic Filter Block

Figure 3:
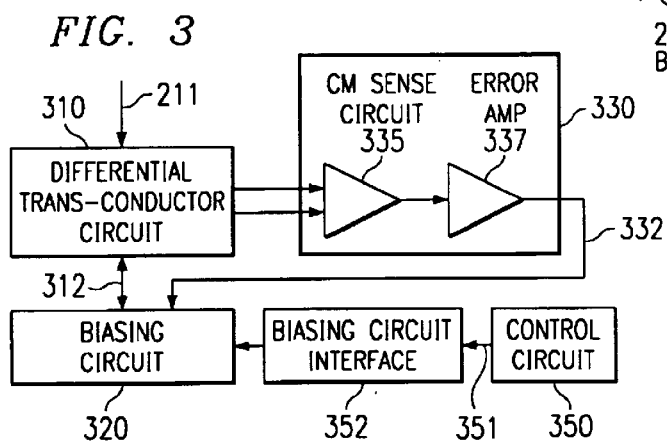
FIG. 3 is a circuit diagram illustrating the details of an embodiment of a basic filter block implemented in accordance with the present invention.

FIG. 3 is a block diagram illustrating the details of an embodiment of basic filter block 251 implemented using trans-conductor circuit. Basic filter block 251 is shown containing differential trans-conductor circuit 310, biasing circuit 320, common mode feedback circuit 330, bias interface circuit 340 and control circuit 350. Each component is described below in further detail.

Differential trans-conductor circuit 310 may receive input signal (211) with a voltage level of Vin and generate a corresponding output signals according to equations (1) and (2). In an embodiment, differential trans-conductor circuit 310 is implemented using PMOS transistors. The output signal is shown provided to common mode feedback circuit 330.

Control circuit 350 may have the same transfer function (in terms of converting voltage to electric current) as trans-conductor circuit 310. However, control circuit 350 may operate using a direct current (dc) voltage such that the output of control circuit accurately represents a quiescent voltage (may approximately equal Vdd/2 on line 351). In an embodiment, control circuit 350 contains the same components and topology as trans-conductor circuit 310, and may be implemented in a known way.

Common mode feedback circuit 330 is shown containing common mode sense circuit 335 and error amplifier 337. Common mode sense circuit 335 may be designed to generate a common mode voltage on path 332. In addition, common mode sense circuit 335 may be designed to operate across a large frequency range. Error amplifier 337 may amplify the signal generated by common mode sense circuit 335 to provide a feedback signal on path 332.

In an embodiment described below with reference to FIG. 4, error amplifier 337 may be implemented within biasing circuit 320. Bias interface circuit 352 may provide an interface between control circuit 350 and biasing circuit 320.

Biasing circuit 320 generates a biasing signal on path 312. The biasing signal biases (by providing a biasing signal) differential trans-conductor circuit 310 and sets the operating point. As is well known, the operating point generally refers to a steady-state operation of a circuit. In an embodiment, biasing circuit 320 may be implemented using NMOS transistors as shown.

The biasing signal (generated by biasing circuit 320) and the feedback signal (generated on path 332) are combined and provided on path 312. Due to such combining, the number of components to implement the basic blocks may be minimized, leading to several advantages (such as reduction in noise introduced and power consumption). The description is continued with reference to the circuit level implementation of basic filter block 251.

5. Circuit Implementation

Figure 4:
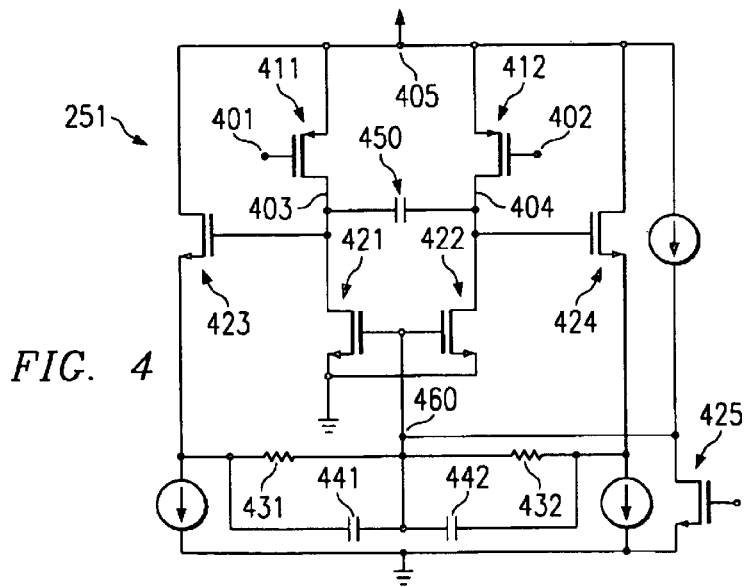
FIG. 4 is a circuit diagram of a basic filter block illustrating additional implementation in an embodiment of the present invention.

FIG. 4 is a circuit diagram illustrating the details of an embodiment of basic filter block 251. FIG. 4 is shown containing PMOS transistors 411 and 412, NMOS transistors 421 through 425, resistors 431 and 432, capacitors 441 and 442, and load 450. Each component is described in further detail below. The relationship of the components of FIG. 4 with the components of FIG. 3 is also noted for the convenience of the reader.

Gate terminal 401 of PMOS transistors 411 is shown connected to the positive input signal (INP) and gate terminal 402 of PMOS transistor 412 is shown connected to negative input signal (INM). The signals INP and INM together represent the differential input signal with a voltage level of Vin. The two transistors together generate a corresponding output signal Vout across load 450. The source terminal of both PMOS transistors 411 and 412 is connected to voltage Avdd (Supply) provided at point 405.

PMOS transistors 411 and 412 together form an embodiment of differential trans-conductor circuit 310 of FIG. 3. However, it will be apparent to one skilled in the arts to implement various alternative embodiments without departing from the scope and spirit of the present invention. For example, basic filter block 251 may be implemented using PMOS transistors in lieu of NMOS transistors and vice versa.

Resistors 431 and 432, capacitors 441 and 442, and NMOS transistors 423 and 424 may together represent common mode sense circuit 335, and the sensed signal is provided back to NMOS transistors 421 and 422, which provided the function of biasing circuit 320. NMOS transistors 423 and 424 may be implemented as source followers and used to provide common mode feedback to NMOS transistors 421 and 422. Resistors 431 and 432, and capacitors 441 and 442 may be designed such that the common mode voltage Vcm may be obtained at point 460. Common mode voltage may be represented as follows:

$$Vcm = (Vop + Vom)/2 \qquad \text{Equation (3)}$$

wherein 'Vcm' represents the common mode voltage, 'Vop' represents the positive output voltage, 'Vom' represents the negative output voltage, '+' represents the addition operation, and '/' represents the division operation.

The biasing signal is received at the gate of NMOS transistor 425, which is provided to the gate of NMOS transistors 421 and 422 to set the operating point. NMOS transistor 425 may correspond to the interface between control circuit 350 (shown only in FIG. 3) and NMOS transistors 421 and 422. The drain terminal 460 of NMOS transistors 425 may be connected to the gate terminals of NMOS transistors 421 and 422.

From the above, it may be appreciated that the common mode feedback signal is generated at node 460. Again 460 is connected to the drain of NMOS transistor 425. Biasing circuit (via NMOS transistor 425) drives node 460 (gate terminal of NMOS transistors 421 and 422) to a desired voltage (as determined by the biasing circuit. Thus, the output common mode voltage equals the voltage at node 460.

The pair of NMOS transistors 421 and 422 also acts as an error amplifier to ensure that the common mode voltage generated by R-C circuit is the desired voltage determined by the biasing circuit. That is, both the signals are getting combined at node 460 and applied to the basic trans-conductor block 411 and 412 by NMOS transistors 421 and 422.

By combining the common-mode feedback signal and the biasing voltage (which sets the operating point), and providing the combined signal on the same path, the number of components in an integrated circuit may be reduced. The reduction in components generally implies reduced noise and fewer parasitic poles (implying ability to operate at high bandwidth). The reduction also leads to reduced power consumption.

Thus, a basic block provided in accordance with the present invention can be used in components such as filters and amplifiers to implement devices such as cell phones, which may need to operate at high bandwidth while consuming minimal power.

6. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. A basic block used to implement a filter circuit, said basic block comprising:
   a trans-conductor circuit generating an output in response to receiving an input;
   biasing circuit providing a biasing signal to set an operating point of said trans-conductor circuit;
   a common-mode feedback circuit generating a feedback signal based on said output and providing said feedback signal to said trans-conductor circuit,
   wherein said biasing signal and said feedback signal are combined and provided on a common path to said trans-conductor circuit; and
   a control circuit generating a quiescent voltage of said trans-conductor circuit, wherein said control circuit is implemented to have a same transfer function as said trans-conductor circuit, said quiescent voltage being provided to said biasing circuit.

2. The basic block of claim 1, wherein said control circuit is implemented similar to said trans-conductor circuit and operated on by using a D.C. voltage to determine said quiescent voltage.

3. The basic block of claim 1, wherein said common-mode feedback circuit comprises:
   a common mode sense circuit generating a common mode voltage according to said input and said output; and
   an error amplifier amplifying said common mode voltage and providing a resulting amplified output to said biasing circuit.

4. The basic block of claim 3, wherein said error amplifier is integrated into said biasing circuit.

5. A device comprising:
   a basic block comprising:
      a trans-conductor circuit generating an output in response to receiving an input;
      biasing circuit providing a biasing signal to set an operating point of said trans-conductor circuit;
      a common-mode feedback circuit generating a feedback signal based on said output and providing said feedback signal to said trans-conductor circuit; and
      a control circuit generating a quiescent voltage of said trans-conductor circuit, wherein said control circuit is implemented to have a same transfer function as said trans-conductor circuit, said quiescent voltage being provided to said biasing circuit,
      wherein said biasing signal and said feedback signal are combined and provided on a common path to said trans-conductor circuit.

6. The device of claim 5, wherein said control circuit is implemented similar to said trans-conductor circuit and operated on by using a D.C. voltage to determine said quiescent voltage.

7. The device of claim 5, wherein said common-mode feedback circuit comprises:

a common mode sense circuit generating a common mode voltage according to said input and said output; and an error amplifier amplifying said common mode voltage and providing a resulting amplified output to said biasing circuit.

8. The device of claim 7, wherein said error amplifier is integrated into said biasing circuit.

9. The device of claim 5, further comprising:

an antenna receiving an external signal, wherein said input is generated based on said external signal;

a filter circuit comprising said basic block, and generating said output;

an analog to digital converter converting said output to a plurality of digital samples; and a processing unit processing said plurality of digital samples.

10. The invention of claim 9, wherein said device comprises one of a mobile phone and a global positioning system receiver.

11. A filter circuit comprising:

a trans-conductor circuit means generating an output in response to receiving an input;

biasing means providing a biasing signal to set an operating point of said trans-conductor circuit;

feedback means generating a feedback signal based on said output and providing said feedback signal to said trans-conductor circuit means; and a control means generating a quiescent voltage of said trans-conductor circuit means, wherein said control means is implemented to have a same transfer function as said trans-conductor circuit means, said quiescent voltage being provided to said biasing means, wherein said biasing signal and said feedback signal are combined and provided on a common path to said trans-conductor circuit.

12. The filter circuit of claim 11, wherein said control means is implemented similar to said trans-conductor circuit means and operated on by using a D.C. voltage to determine said quiescent voltage.

13. The filter circuit of claim 12, wherein said feedback means comprises:

a common mode sense means generating a common mode voltage according to said input and said output; and amplifying means amplifying said common mode voltage and providing a resulting amplified output to said biasing means.

14. The filter circuit of claim 13, wherein said amplifying means is integrated into said biasing means.

15. The filter circuit of claim 11, wherein said trans-conductor circuit means comprises a plurality of PMOS transistors and said biasing means comprises a plurality of NMOS transistors.

* * * * *